United States Patent
Liu et al.

(10) Patent No.: US 7,763,959 B2
(45) Date of Patent: Jul. 27, 2010

(54) HEAT SLUG FOR PACKAGE STRUCTURE

(75) Inventors: Cheng-cheng Liu, Kaohsiung (TW);
Jun-cheng Liu, Kaohsiung (TW);
Hsin-hao Chen, Kaohsiung (TW);
Chi-ming Chen, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 11/834,863

(22) Filed: Aug. 7, 2007

(65) Prior Publication Data
US 2008/0048304 A1 Feb. 28, 2008

(30) Foreign Application Priority Data
Aug. 22, 2006 (TW) ................ 95130773 A

(51) Int. Cl.
*H01L 23/495* (2006.01)
*H01L 23/34* (2006.01)

(52) U.S. Cl. .............. 257/675; 257/E23.102; 257/E23.092; 257/E23.127; 257/720; 257/666; 257/712; 257/774; 257/773; 257/680; 257/713

(58) Field of Classification Search .......... 257/675, 257/720, E23.102, E23.092, E23.127, 712, 257/713, 717, 684, 774, 773, 679, 680, 676
See application file for complete search history.

(56) References Cited

U.S. PATENT DOCUMENTS

| 5,105,259 | A | * | 4/1992 | McShane et al. | 257/667 |
| 5,659,200 | A | * | 8/1997 | Sono et al. | 257/713 |
| 6,255,742 | B1 | * | 7/2001 | Inaba | 257/796 |
| 6,437,427 | B1 | * | 8/2002 | Choi | 257/666 |
| 6,506,629 | B1 | | 1/2003 | Kinsman et al. | |
| 2005/0077623 | A1 | * | 4/2005 | Roberts et al. | 257/724 |
| 2008/0083931 | A1 | * | 4/2008 | Bando et al. | 257/99 |

FOREIGN PATENT DOCUMENTS

| JP | 6-80748 | | 10/1987 |
| JP | 2005-191178 | * | 7/2005 |
| WO | 02/089219 A1 | * | 11/2002 |

* cited by examiner

*Primary Examiner*—Alexander O Williams
(74) *Attorney, Agent, or Firm*—Morris, Manning & Martin LLP; Tim Tingkang Xia

(57) ABSTRACT

A heat slug is provided for a package structure, including a main body and a plurality of protrusions. The main body has a surface in which at least one ditch is defined. Each protrusion is connected to and extends from the main body and has a surface in which a plurality of dimples is defined.

20 Claims, 7 Drawing Sheets

HEAT SLUG FOR PACKAGE STRUCTURE

FIELD OF THE INVENTION

The present invention relates to a heat slug for a package structure, and more specifically, to a heat slug having a surface and at least one ditch, a plurality of dimple thereon, for increasing a stability for the heat slug.

BACKGROUND OF THE INVENTION

With the advancement of manufacturing ability for electronic products, an integrated circuit (IC) has been developed as the most important component of the electronic products for a digitalized society. Digital electric appliances, personal computers, and center data exchange systems for complicated processing of signals and data are all comprised of integrated circuits. Generally, for protection, an integrated circuit is enclosed in a package structure for the integrated circuit contains electric circuits that are often susceptible to physical damages. The package structure also provides electrical connection between the electrical circuit and external circuits through which power and signals can be supplied from or transmitted to the external circuits. In addition, the package structure also provides a heat dissipation interface for the integrated circuit. An integrated circuit often contains a great number of transistors and logic gates, as well as other electronic devices or components, and is operated at an extremely high speed or clock frequency, which causes a significant heat emission. Decreasing thermal resistance of the package for increasing heat dissipation efficiency is an important issue for the IC packages. The removal of heat emission from the IC, if not properly addressed, will adversely affect reliability of the IC and eventually shortening the life span of the IC.

A variety of integrated circuit packages are available, including Thin Small Outline Package (TSOP) and Quad Flat Package (QFP), which comprise a metal leadframe that support the package and pins formed on two sides or four sides of the package to connect to a circuit board on which the IC is disposed. On the other hand, a Ball Grid Array (BGA) package is connected with a circuit board by solder balls, rather than pins. Different heat dissipation solutions are required for different types of package structures. Moreover, many solutions have been developed in order to increase the heat dissipation efficiency for various types of package structures, such as changing the structure design, utilizing a high thermal conductivity material and the likes, are all used for removing heat from the package structures. However, feasible changes and modification of the structure and the material are limited, and the heat dissipation efficiency is getting more and more insufficient with the rapid increase of the number of electronic devices or components comprised in an IC. One of the most commonly seen solutions that are developed to address the above discussed problems is to dispose a heat slug inside the IC package structure for increasing the heat dissipation efficiency.

Referring to FIGS. 1 and 2, wherein FIG. 1 is a schematic side elevational view of a QFP structure, designated at 10, containing a conventional heat slug 18, and FIG. 2 is a top view of the conventional heat slug 18, as shown in FIG. 1, the QFP structure 10 comprises a die 12, a leadframe 14, a mold compound 16 and the heat slug 18. The leadframe 14 has a plurality of leadframe finger 14a and a die attach pad 14b. The die 12 is disposed on the die attach pad 14b of the leadframe 14 and electrically connected with the leadframe fingers 14a by leads 28. The mold compound 16 encloses the die 12 and a portion of the leadframe 14, and is cured in shape. The heat slug 18 is made of a high thermal conductivity material, such as copper and aluminum. Furthermore, the heat slug 18 may also comprise an electro-deposited coating on a surface thereof. The heat slug 18 illustrated in FIG. 1 is an Exposed Drop-in Heat Slug (EDHS), which has one side exposed to the exterior for efficiently dissipating the heat generated by the die 12 to the surrounding.

As shown in FIG. 2, the conventional heat slug 18 comprises a main body 22 and a plurality of protrusions 24. The main body 22 is positioned closely adjacent to the die attach pad 14b of the leadframe 14 for receiving the heat generated by the die 12, which is then dissipated through surfaces of the heat slug 18. The main body 22 can be put in direct engagement with the die attach pad 14b for transmitting the heat to the heat slug 18 via the die attach pad 14b. Alternatively, the main body 22 can be bonded to the die attach pad 14b by the mold compound 16 or an adhesive for transmitting the heat to the heat slug 18 via the die attach pad 14b and the mold compound 16 or the adhesive. Moreover, each protrusion 24 has a slot 26 for effecting tight engagement between the heat slug 18 and the mold compound 16.

However, the QFP package structure 10, when put in a high-temperature, high-humidity environment, is often subject to alteration of the structure due to high temperature and high humidity. Particularly, a gap may occur in delamination between the main body 22 of the heat slug 18 and the die attach pad 14b of the leadframe 14. For example, an excessive gap between the heat slug 18 and the die attach pad 14b is observed when the conventional QFP structure 10 is subject to a test of moisture sensitivity level 3 (MSL3) at 260° C. The gap spoils the tight engagement between the heat slug 18 and the leadframe 14 and retards transfer of the heat generated by the die 12 to the heat slug 18, damaging the performance of heat dissipation of the QFP structure 10. Moreover, an oversize gap not only reduces the expected heat dissipation efficiency of the package structure but may also cause physical damage to the package structure.

SUMMARY OF THE INVENTION

A primary objective of the present invention is to provide a leadframe structure with a high density of leadframe finger arrangement for solving the problems highlighted of a prior art package structure.

Accordingly, in accordance with the present invention, a heat slug is provided for a leadframe of a package structure of an integrated circuit. The heat slug comprises a main body and a plurality of protrusions. The main body has an upper surface in which at least one ditch is defined, and the ditch surrounds a region of the upper surface of the main body, wherein the region is attached to a lower surface of a die attach pad of a leadframe. Each protrusion is connected to and extends from the main body and has a surface in which a plurality of dimples is defined.

Furthermore, another objective of the present invention is to provide a package structure, comprising a heat slug, a die, a leadframe and a mold compound. The heat slug comprises a main body and a plurality of protrusions, wherein the main body has an upper surface in which at least one ditch is defined and the ditch surrounds a region of the upper surface of the main body. Each protrusion is connected to and extends from the main body and has a surface in which a plurality of dimples is defined. The leadframe has a die attach pad which has an upper surface for supporting a die and a lower surface attached to the region of the upper surface of the main body.

The mold compound encloses the die, the heat slug and a portion of the leadframe, and the compound also fills up the ditch and the dimples.

Consequently, contact area between the heat slug and the mold compound can be enlarged with enhanced engagement therebetween because at least one ditch and a plurality of dimples are formed in the surface of the heat slug. Thus, the heat slug and the leadframe can maintain tight and firm engagement therebetween even they are put in a high temperature and high humidity environment, and excessive or oversize gap is prevented from occurring in the package structure. Therefore, the package structure in accordance with the present invention not only effects the desired heat dissipation performance, but also protects the package structure from being damaged.

It is to be understood that both the foregoing general description and the following detailed description of the present invention are exemplary and explanatory and are intended to provide a few optimal embodiments and descriptions in details in conjunction with the accompanying drawings.

DETAILED DESCRIPTION OF THE INVENTION

The present invention will now be described more specifically with reference to the following embodiments. It is to be noted that the following description of the preferred embodiments of the present invention are presented herein for purpose of illustration and description only and it is not intended to be exhaustive or to be limited to the precise form disclosed.

Figure 1:
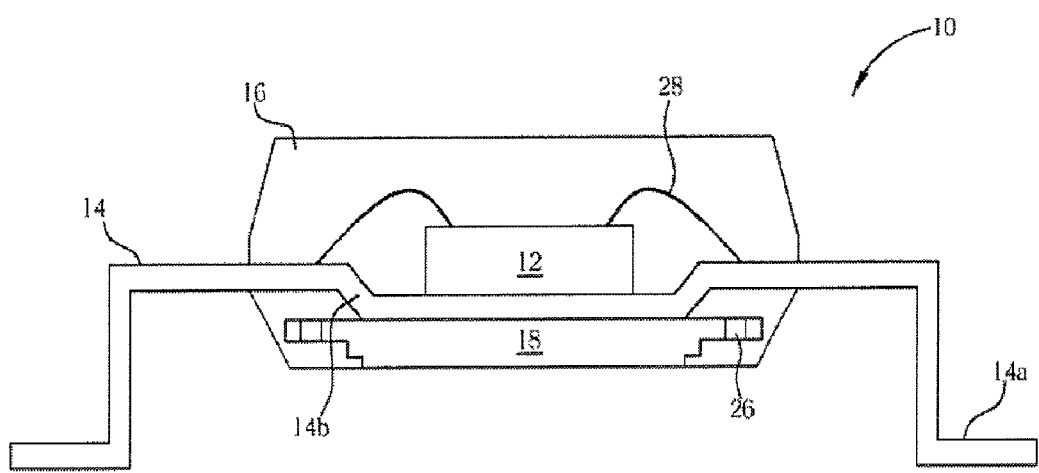
FIG. 1 is a schematic side elevational view of a QFP structure incorporating a conventional heat slug.
Figure 2:
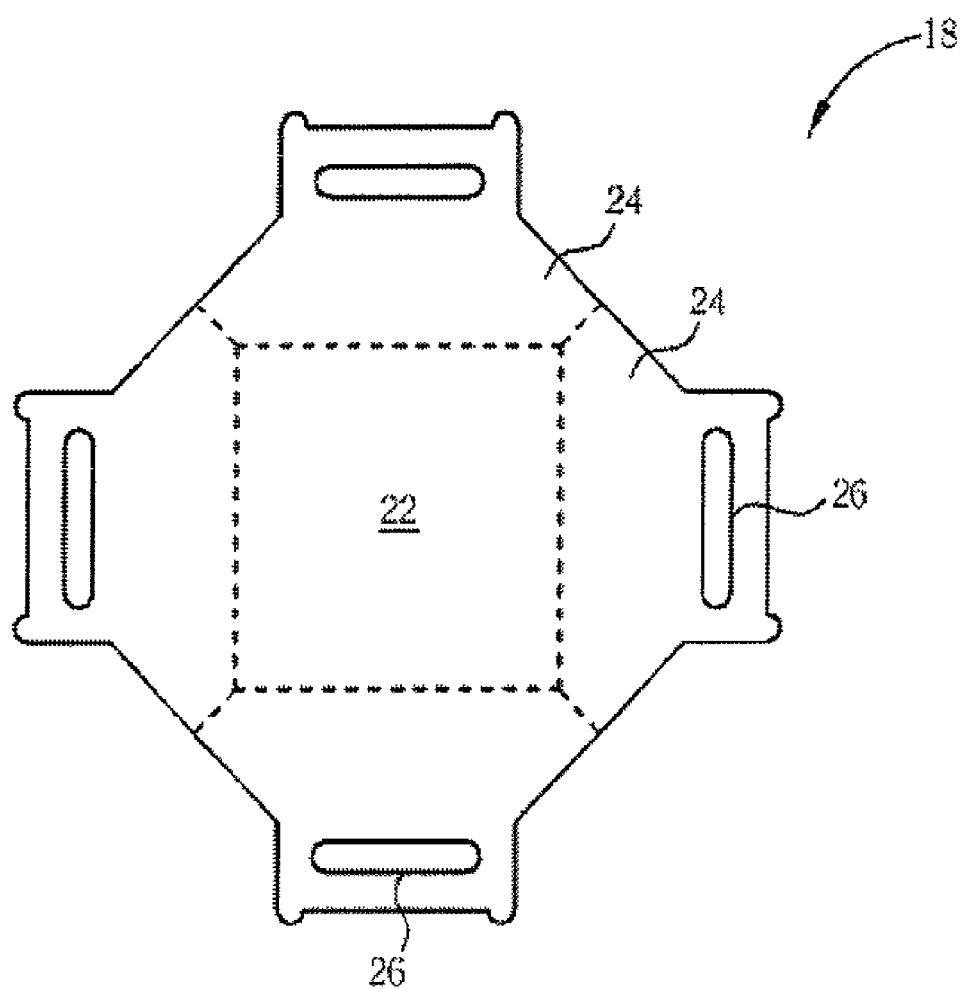
FIG. 2 is a top view of the conventional heat slug.
Figure 3:
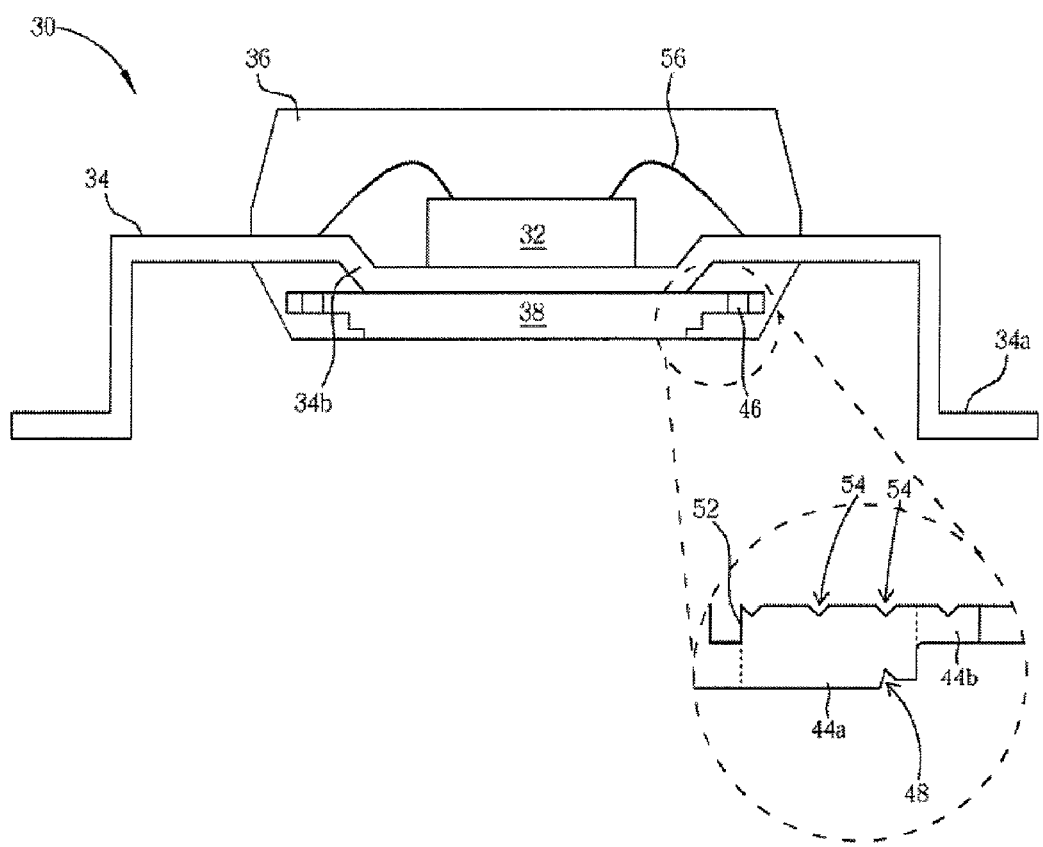
FIG. 3 is a cross-sectional view of a QFP structure incorporating a heat slug according to a first embodiment of the present invention.

The present invention provides a heat slug that can be applied to various package structures, such as a quad flat package (QFP), a thin small outline package (TSOP), a low-profile quad flat package (LQFP) and the likes. In the following description, an explanation of the present invention will be made with reference to FIG. 3 and FIG. 4 in which a QFP structure is taken as an example. FIG. 3 is a cross-sectional view illustrating a QFP structure constructed in accordance with a first embodiment of the present invention, generally designate with reference numeral 30 and comprising a heat slug 38, and FIG. 4 more clearly illustrates the heat slug 38 of FIG. 3 in a top plan view. The QFP structure 30 comprises a die 32, a leadframe 34, a mold compound 36, and the heat slug 38, wherein the leadframe 34 has a plurality of leadframe fingers 34a and a die attach pad 34b connected to the leadframe fingers 34a. The die 32 is disposed on and fixed to the die attach pad 34b of the leadframe 34 with a die attach epoxy or a silver epoxy. In addition, the die 32 is electrically connected to the leadframe fingers 34a of the leadframe 34 by wire bonding whereby input/output landing pads (not shown) of the die 32 are connected to the leadframe fingers 34a by wires 56. The mold compound 36 encloses the die 32 and a portion of the leadframe 34, and is cured in shape for protecting the QFP structure 30 against humidity, impurities and mechanical damages, and also facilitating heat dissipation performance.

The heat slug 38 is made of high thermal conductive materials, such as aluminum and copper, and a surface of the heat slug 38 may select from an electro-deposited coating (not shown). In addition, the heat slug 38 illustrated in FIG. 3 as an example for the disclosure comprises an exposed drop-in heat slug (EDHS), of which one surface is exposed to the exterior for efficiently dissipating heat generated by the die 32 to the surroundings. Alternatively, the heat slug of the present invention can made a drop-in heat slug, which is, in generally, not directly exposed to the exterior, but is instead substantially completely housed in the mold compound 36.

Figure 4:
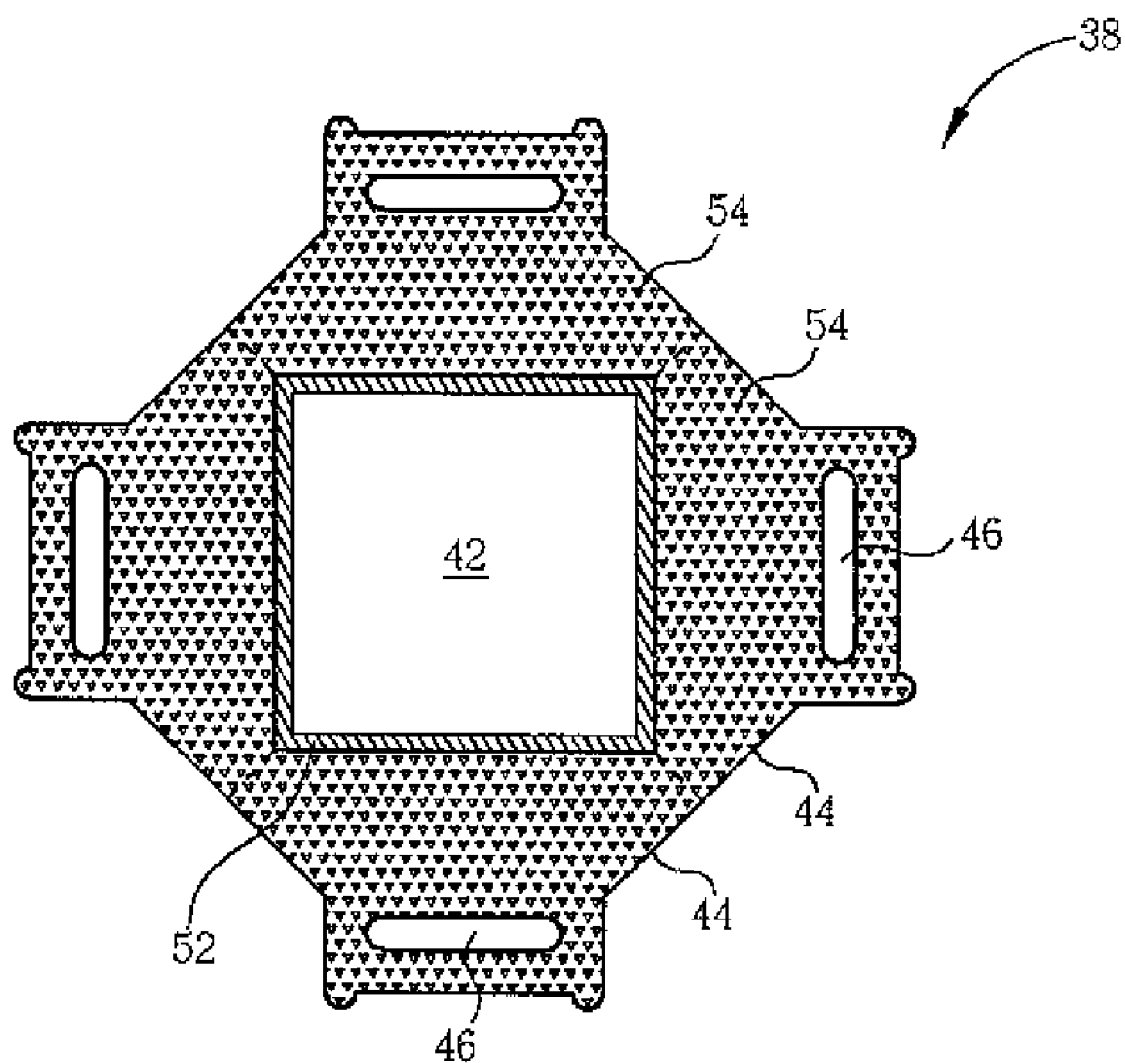
FIG. 4 is a top view of the heat slug of FIG. 3.

As shown in FIG. 4, the heat slug 38 comprises a main body 42 and a plurality of protrusions 44. In the embodiment illustrated, the main body 42 is made rectangular in shape to correspond to the shape of the die 32. The main body 42 has a flat upper surface closely adjacent to the die attach pad 34b of the leadframe 34 for receiving the heat generated by the die 32, and dissipating the heat through surfaces of the heat slug 38. Alternatively, the main body 42 can be in direct physical engagement with the die attach pad 34b so that heat can be transmitted to the heat slug 38 from the die attach pad 34b; or the main body 42 can be adjoined to the die attach pad 34b by the mold compound 36 or an adhesive so that heat is transmitted from the die attach pad 34b to the heat slug 38 via the mold compound 36 and/or the adhesive.

Each protrusion 44 is connected to and extends from the main body 42. For example, the protrusions 44 are connecting the four edges of the rectangular main body 42 and extend from the main body 42 in lateral directions. Each protrusion 44 has a first peripheral section 44a and a second peripheral section 44b. The first peripheral section 44a surround a circumference of the main body 42 and the second peripheral section 44b surround the first peripheral sections 44a. The first peripheral section 44a has a thickness greater than a thickness of the second peripheral section 44b. One surface of the first peripheral section 44a can thus be made exposed to the exterior of the surface of the mold compound 36 for directly dissipating the heat generated by the die 32 to the surroundings.

The heat slug 38 has a lower surface in which at least one groove 48 is formed. Each protrusion 44 forms at least one slot 46. For example, each protrusion 44 forms an elongated slot substantially paralleled with a circumference of the main body 42. The slot 46 extends completely through the upper and lower surfaces of the heat slug 38. The slot 46 and the groove 48 are both used to provide tight and firm engagement of the mold compound 36 with respect to the heat slug 38.

In accordance with the present invention, the heat slug 38 is provided at the upper surface thereof with at least one ditch 52, which, in the embodiment illustrated, is formed to surround the main body 42. Each protrusion 44 forms a plurality of dimples 54 on the upper surface. The ditch 52 formed on the upper surface of the heat slug 38 allows the mold compound 36 to fill therein so as to enhance tightness of engagement of the mold compound 36 with the heat slug 38. Further, the mold compound 36 also serves to fix the relative position between the heat slug 38 and the die attach pad 34b of the leadframe 34 so as to avoid a gap unexpectedly formed between the heat slug 38 and the leadframe 34. Further, as shown in FIG. 4, the dimples 54 are preferably arranged in an array, and each dimple 54 is configured to have a broad upper end and a narrow lower end for increasing contact area between the heat slug 38 and the mold compound 36 so as to also improve the tightness of engagement between the heat slug 38 and the mold compound 36.

Figure 5:
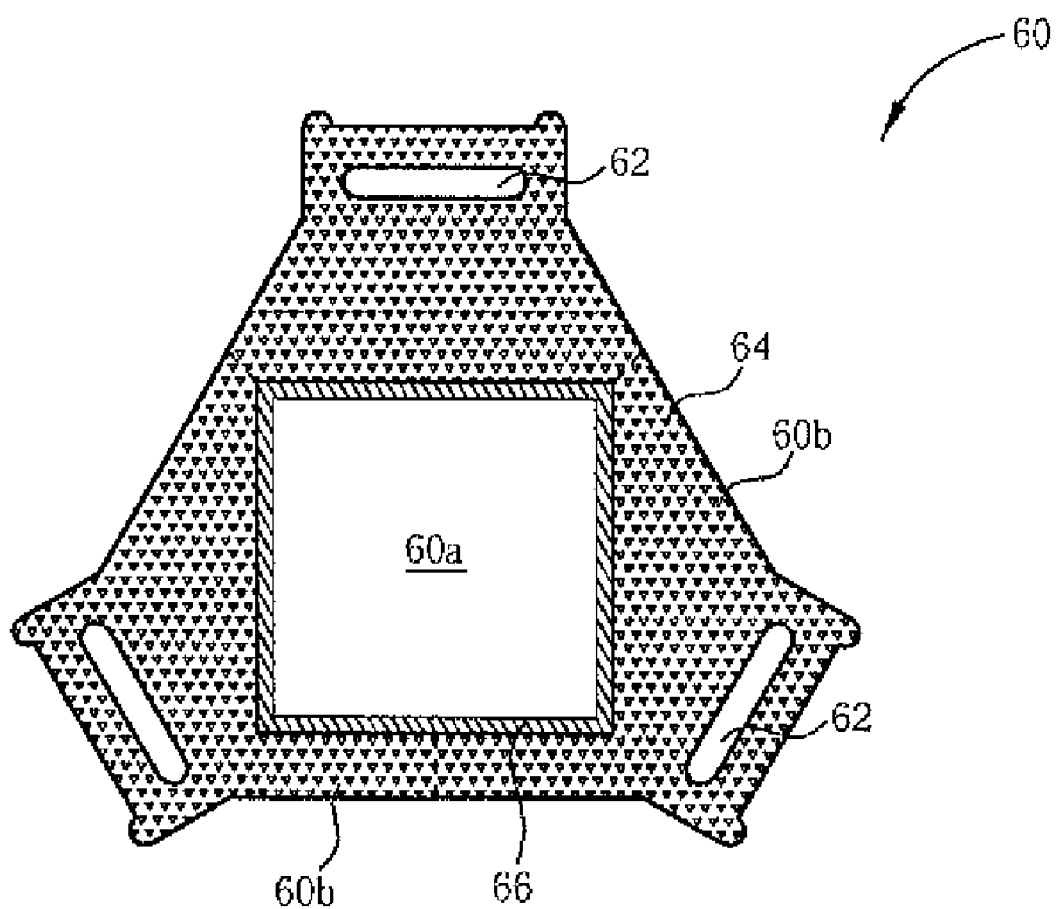
FIG. 5 is a top view of a heat slug according to a second embodiment of the present invention.
Figure 6:
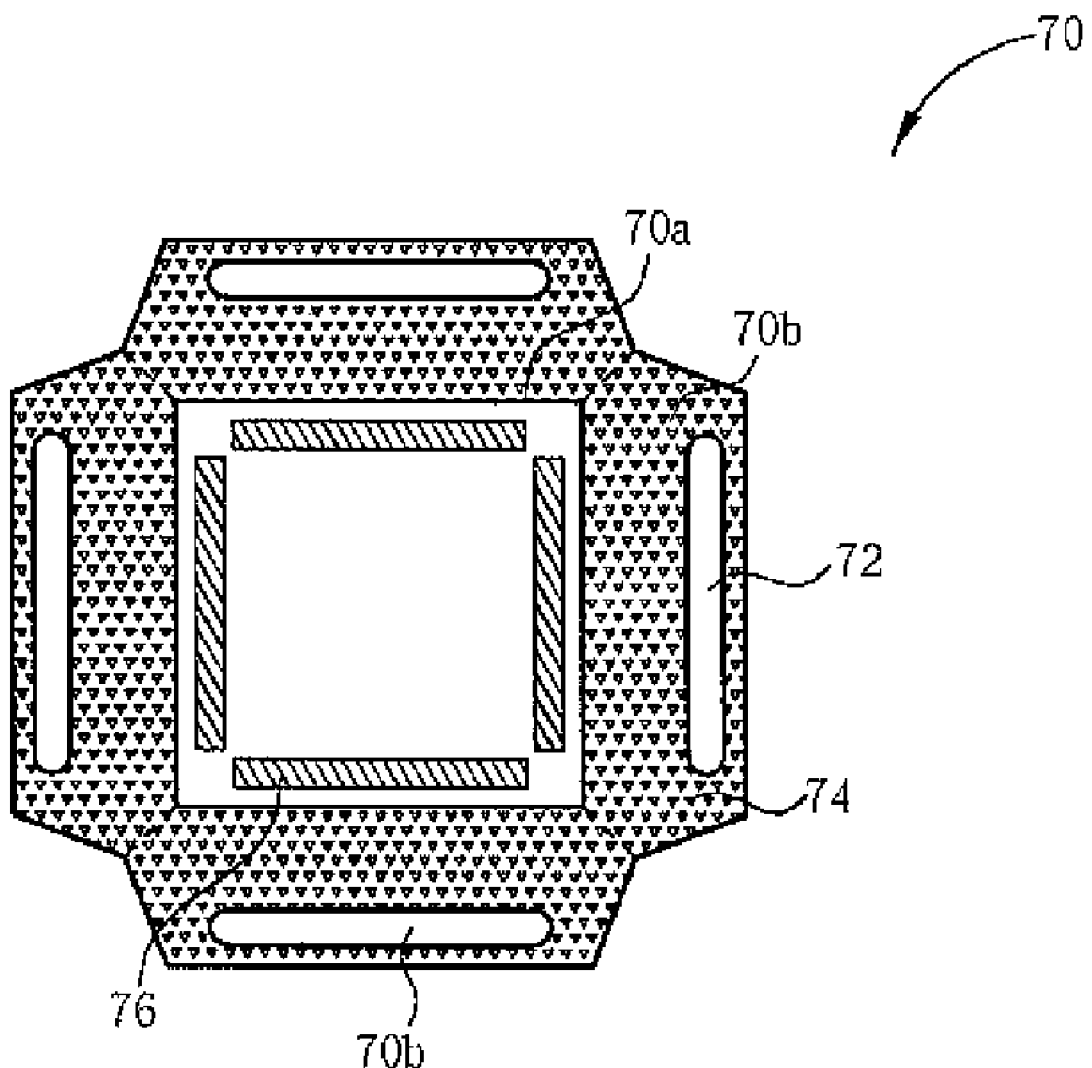
FIG. 6 is a top view of a heat slug according to a third embodiment of the present invention.
Figure 7:
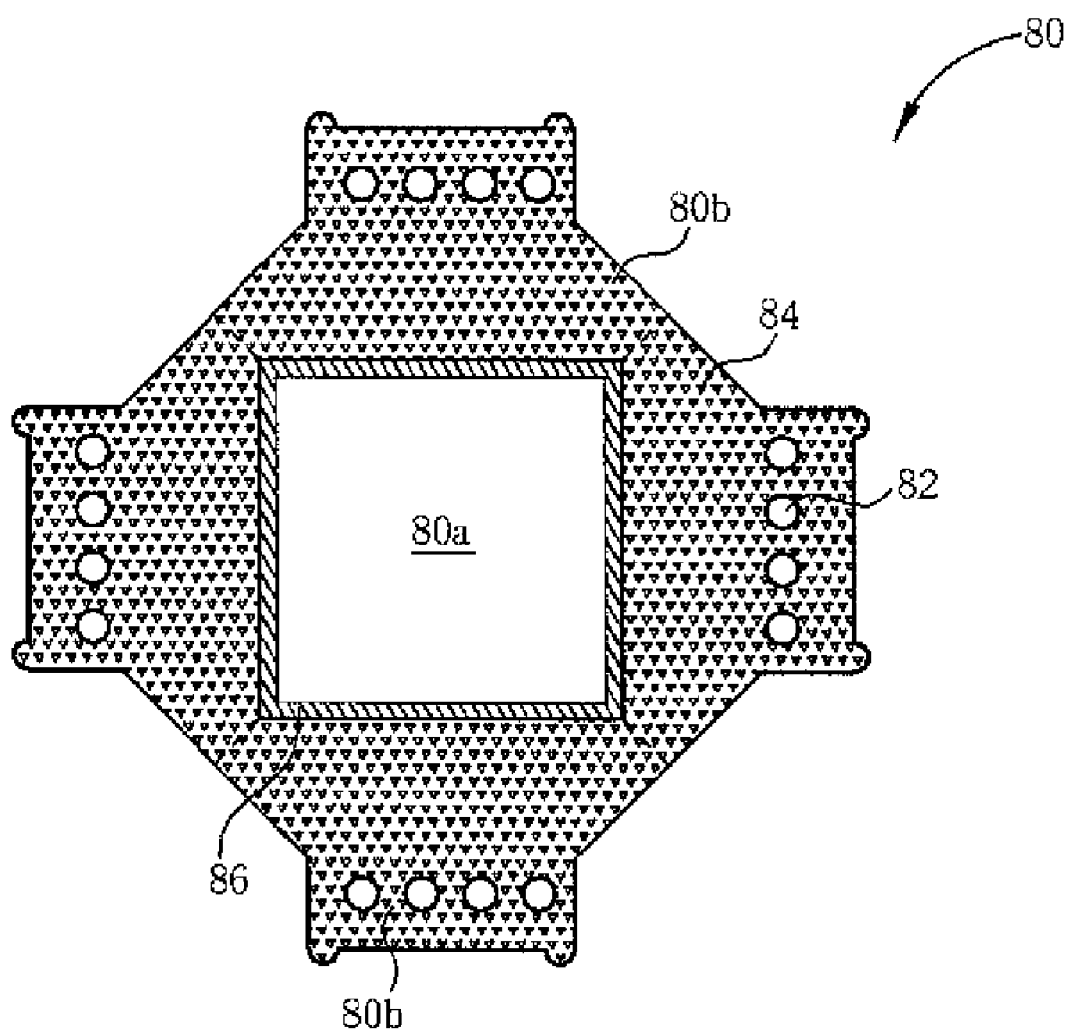
FIG. 7 is a top view of a heat slug according to a fourth embodiment of the present invention.

Referring to FIG. 5 to FIG. 7, FIG. 5 is a top view of a heat slug 60 constructed in accordance with a second embodiment of the present invention; FIG. 6 is a top view of a heat slug 70 constructed in accordance with a third embodiment of the present invention; and FIG. 7 is a top view of a heat slug 80 constructed in accordance with a fourth embodiment of the present invention.

As shown in FIG. 5 the heat slug 60 of the second embodiment comprises a rectangular main body 60a and three protrusions 60b. The main body 60a has a flat upper surface positioned closely adjacent to the die attach pad of the leadframe. Each protrusion 60b forms at least one slot 62 extending completely through the upper surface and an opposite lower surface of the heat slug 60 and parallel with a circumference of the main body 60a. Each protrusion 60b forms a plurality of dimples 64 on the surface thereof, for increasing contact area between the heat slug 60 and the mold compound so as to tightly fix the heat slug 60 in position. The upper surface of the main body 60a forms a ditch 66 surrounding a circumference of the main body 42 for the purposes of fixing the die attach pad with respect to the heat slug 60 and avoiding formation of a gap between the heat slug 60 and the leadframe.

As show in FIG. 6, the heat slug 70 of the third embodiment comprises a rectangular main body 70a and four protrusions 70b. The main body 70a has a flat upper surface positioned closely adjacent to the die attach pad of the leadframe. Each protrusion 70b forms at least one slot 72 extending through the upper surface and an opposite lower surface of the heat slug 70 and parallel with a circumference of the main body 70a. Each protrusion 70b forms a plurality of dimples 74 on the surface thereof for increasing contact area between the heat slug 70 and the mold compound. Instead of a single continuous ditch extending along a circumference of the main body, the instant embodiment provides four separate ditches 76 that are defined in the upper surface of the main body 70a to be respectively parallel with four edges of the rectangular main body 70a. Again, the ditches 76 serve the purposes of securely fixing the die attach pad with respect to the heat slug 70.

As shown in FIG. 7, the heat slug 80 of the fourth embodiment comprises a rectangular main body 80a and four protrusions 80b. The main body 80a has a flat upper surface positioned closely adjacent to the die attach pad of the leadframe. Each protrusion 80b forms a plurality of slots 82 all extending completely through the upper surface and an opposite lower surface of the heat slug 80. For example, each protrusion 80b has four slots 82 distributed in a spaced manner in a direction substantially parallel with one of the four edges of the rectangular main body 80a. Each protrusion 80b forms a plurality of dimples 84 on the surface thereof. Again, the upper surface of the main body 80a forms a single continuous ditch 86 surrounding a circumference of the main body 80a.

As previously described, contact area between the heat slug and the mold compound is effectively enlarged so as to fix the relative position between the leadframe and the heat slug due to the fact that the surface of the heat slug in accordance with the present invention forms at least one ditch and a plurality of dimples. Consequently, the risk of forming a gap between the heat slug and the leadframe is eliminated. The heat slug and the leadframe of the present invention can be tightly and firmly fixed together even in high temperature and high humidity conditions and separation between the heat slug and the leadframe is prevented. Therefore, the present invention effectively provides the package structure with the expected heat dissipation efficiency, and also protects the package structure from undesired physical damages.

What is claimed is:

1. A heat slug for a leadframe of a package structure, comprising:
   a main body having an upper surface defining at least one ditch which surrounds a region of the upper surface of the main body, wherein the whole region is substantially attached to a lower surface of a die attach pad of the leadframe; and
   a plurality of protrusions extending outwardly from the region and the ditch of the main body and surrounding the region and the ditch of the main body, each protrusion having an upper surface in which dimples are defined, wherein the dimples surround the region and the ditch of the main body.

2. The heat slug as claimed in claim 1, wherein the dimples are arranged in an array.

3. The heat slug as claimed in claim 1, wherein each protrusion comprises a first peripheral section surrounding the main body and a second peripheral section surrounding the first peripheral section.

4. The heat slug as claimed in claim 3, wherein the first peripheral section has a thickness that is greater than thickness of the second peripheral section.

5. The heat slug as claimed in claim 1, wherein the heat slug has a lower surface in which at least one groove is defined.

6. The heat slug as claimed in claim 1, wherein each protrusion forms at least one opening.

7. The heat slug as claimed in claim 6, wherein the opening comprises an elongated slot.

8. The heat slug as claimed in claim 7, wherein the elongated slot is substantially parallel with an edge of the main body.

9. The heat slug as claimed in claim 1, wherein each dimple is configured in a shape having a broad upper area and a narrow lower area.

10. A package structure, comprising:
    a heat slug comprising:
    a main body having an upper surface in which at least one ditch is defined, wherein the ditch surrounds a region of the upper surface of the main body; and
    a plurality of protrusions connected to and extending outwardly from the region and the ditch of the main body and surrounding the region and the ditch of the main body, each protrusion having an upper surface in which a plurality of dimples are defined, wherein the dimples surround the region and the ditch of the main body;
    a leadframe having a die attach pad which has an upper surface for supporting a die and a lower surface substantially attached to the whole region of the upper surface of the main body; and
    a molding compound enclosing the die, the heat slug and at least a portion of the leadframe, and filling up the ditch and the dimples.

11. The package structure as claimed in claim 10, wherein the dimples are arranged in an array.

12. The package structure as claimed in claim 10, wherein each protrusion comprises a first peripheral section surrounding the main body and a second peripheral section surrounding the first peripheral section.

13. The package structure as claimed in claim 12, wherein the first peripheral section has a thickness greater than the thickness of the second peripheral section.

14. The package structure as claimed in claim 10, wherein the heat slug has a lower surface in which at least one groove is defined.

15. The package structure as claimed in claim 10, wherein each protrusion forms at least one opening.

16. The package structure as claimed in claim 15, wherein the opening comprises an elongated slot.

17. The package structure as claimed in claim 16, wherein the elongated slot is parallel with an edge of the main body.

18. The package structure as claimed in claim 16, wherein each dimple is configured in a shape having a broad upper area and a narrow lower area.

19. The heat slug as claimed in claim 1, wherein the depth of each of the dimples is smaller than that of the ditch.

20. The package structure as claimed in claim 16, wherein the depth of each of the dimples is smaller than that of the ditch.

* * * * *